(12) United States Patent
Yu et al.

(10) Patent No.: US 9,583,519 B2
(45) Date of Patent: Feb. 28, 2017

(54) MANUFACTURING METHOD OF A THIN FILM TRANSISTOR AND PIXEL UNIT THEREOF

(71) Applicant: SHENZHEN ROYOLE TECHNOLOGIES CO. LTD., Shenzhen (CN)

(72) Inventors: Xiaojun Yu, Shenzhen (CN); Peng Wei, Shenzhen (CN); Zihong Liu, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/757,934

(22) Filed: Dec. 23, 2015

(65) Prior Publication Data
US 2016/0126263 A1 May 5, 2016

Related U.S. Application Data

(63) Continuation of application No. 14/373,308, filed as application No. PCT/CN2013/071471 on Feb. 6, 2013, now Pat. No. 9,269,796.

(51) Int. Cl.
*H01L 21/00* (2006.01)
*H01L 27/12* (2006.01)
(Continued)

(52) U.S. Cl.
CPC ......... *H01L 27/1288* (2013.01); *H01L 21/441* (2013.01); *H01L 21/47573* (2013.01);
(Continued)

(58) Field of Classification Search
CPC ............. H01L 21/441; H01L 21/47573; H01L 21/47635; H01L 27/124; H01L 27/1288; H01L 29/24; H01L 29/41733; H01L 29/66969; H01L 29/7869
(Continued)

(56) References Cited

U.S. PATENT DOCUMENTS

| | | | |
|---|---|---|---|
| 5,814,539 A | * | 9/1998 | Nakazawa ........ H01L 21/28079 257/E29.278 |
| 6,888,160 B1 | * | 5/2005 | Nakajima ........... H01L 27/1214 257/59 |

(Continued)

FOREIGN PATENT DOCUMENTS

| | | |
|---|---|---|
| CN | 102651340 A | 8/2012 |
| JP | 2004-273697 A | 9/2004 |
| WO | WO2014/121469 A1 | 8/2014 |

OTHER PUBLICATIONS

International Search Report, PCT/CN2013/071471, Nov. 21, 2013, 6 pgs.
(Continued)

*Primary Examiner* — Mohammed Shamsuzzaman
(74) *Attorney, Agent, or Firm* — Morgan, Lewis & Bockius LLP

(57) ABSTRACT

The present invention provides a method of manufacturing a thin film transistor pixel unit, comprising: forming a metal oxide layer, a gate insulating layer, a gate metal layer and an etching barrier layer on a substrate, wherein the metal oxide layer is in a thin film transistor region; through a same mask, etching a part of the etching barrier layer, the gate metal layer and the gate insulating layer on the substrate for forming a gate region, source and drain regions for forming contact vias, a gate interface region, and a storage capacitor region, respectively. Through additional steps including etching, metallizing, and filling, a source contact via is formed in the source region, a drain contact via is formed in the drain region, and a connecting contact via is formed in the gate interface region, respectively.

6 Claims, 12 Drawing Sheets

(51) Int. Cl.
 H01L 29/66      (2006.01)
 H01L 21/4763    (2006.01)
 H01L 21/441     (2006.01)
 H01L 21/4757    (2006.01)
 H01L 29/417     (2006.01)
 H01L 29/786     (2006.01)
 H01L 29/24      (2006.01)

(52) U.S. Cl.
 CPC ...... *H01L 21/47635* (2013.01); *H01L 27/124* (2013.01); *H01L 29/24* (2013.01); *H01L 29/41733* (2013.01); *H01L 29/66969* (2013.01); *H01L 29/7869* (2013.01)

(58) Field of Classification Search
 USPC .................. 438/104, 164; 257/43, 57, 40
 See application file for complete search history.

(56) References Cited

U.S. PATENT DOCUMENTS

| | | | | |
|---|---|---|---|---|
| 7,619,248 B1* | 11/2009 | Cleeves | ................ | H01L 29/04 257/57 |
| 8,835,909 B2* | 9/2014 | Han | ................ | C23C 16/401 257/291 |
| 2008/0018850 A1* | 1/2008 | Shih | ................ | H01L 21/268 349/152 |
| 2008/0044964 A1* | 2/2008 | Kamath | ................ | H01L 21/316 438/164 |
| 2010/0072483 A1 | 3/2010 | Bae et al. | | |
| 2013/0126859 A1* | 5/2013 | Yeh | ................ | H01L 29/7869 257/43 |
| 2013/0309808 A1* | 11/2013 | Zhang | ................ | H01L 29/78648 438/104 |
| 2014/0191228 A1* | 7/2014 | Jung | ................ | H01L 29/7869 257/43 |
| 2014/0197408 A1* | 7/2014 | Tsuruma | ................ | H01L 29/7869 257/43 |
| 2015/0021592 A1* | 1/2015 | Seo | ................ | H01L 29/7869 257/43 |
| 2015/0243724 A1* | 8/2015 | Cho | ................ | H01L 29/7869 257/43 |

OTHER PUBLICATIONS

Yu, Notice of Allowance, U.S. Appl. No. 14/373,308, Sep. 25, 2015, 12 pgs.

* cited by examiner

Forming a metal oxide layer, a gate insulating layer, a gate metal layer and an etching barrier layer on a substrate
S101

Through a same mask, etching a part of the etching barrier layer, the gate metal layer and the gate insulating layer on the substrate, while retaining: the metal oxide layer, the gate insulating layer, the gate metal layer and the etching barrier layer in a gate region and a part of the metal oxide layer, the gate insulating layer and the gate metal layer in a source region and a drain region for forming contact vias; and exposing the remaining metal oxide layer in the source region and the drain region
S102

Metalizing the exposed part of the metal oxide layer in the source region and the drain region to form parts of the source and the drain, and then depositing a passivation layer
S103

Etching the passivation layer, the gate metal layer and the gate insulating layer in the source region and the drain region for forming contact vias, exposing the metal oxide layer for forming the contact via in the source region and the drain region, thereby forming a source contact via and a drain contact via
S104

Metalizing the exposed part of the metal oxide layer in the source region and the drain region to connect with the formed parts of the source and the drain respectively for forming the complete source and drain
S105

Filling a conductive material in the source contact via and drain contact via
S106

FIG. 1

| Forming a metal oxide layer, a gate insulating layer, a gate metal layer and an etching barrier layer on a substrate, wherein the metal oxide layer is in the thin film transistor region<br>S201 |

↓

| Through a same mask, etching the etching barrier layer, the gate metal layer and the gate insulating layer on the substrate, and retaining: the metal oxide layer, the gate insulating layer, the gate metal layer and the etching barrier layer in a gate region, a part of the metal oxide layer, the gate insulating layer and the gate metal layer in a source region and a drain region for forming contact vias, the gate insulating layer, the gate metal layer and the etching barrier layer in a gate interface region, and the gate insulating layer and the gate metal layer in a storage capacitor region; and exposing the remaining metal oxide layer in the source region and in the drain region<br>S202 |

↓

| Metalizing the exposed part of the metal oxide layer in the source region and the drain region to form parts of the source and the drain, and then depositing a passivation layer<br>S203 |

↓

| Etching the passivation layer in the source region and the drain region for forming contact vias, and the passivation layer in the gate interface region, thereby forming upper parts of a source contact via, a drain contact via and a connection contact via in the gate interface region<br>S204 |

↓

| Further etching the gate metal layer and the gate insulating layer in the source region and the drain region for forming contact vias, and the etching barrier layer in the gate interface region, exposing a part of metal oxide layer in the source region and the drain region for forming the contact vias, and the gate metal layer in the gate interface region, thereby forming lower parts of the source contact via, the drain contact via and the connection contact via in the gate interface region, which form the complete source contact via, drain contact via and connection contact via in the gate interface region with the upper part of the source contact via, the drain contact via and the connection contact via in the gate interface region<br>S205 |

↓

| Metalizing the exposed part of the metal oxide layer in the source region and the drain region to connect with the formed part of the source and drain respectively for forming the complete source and the complete drain<br>S206 |

↓

| Filling a conductive material in the source contact via, drain contact via and the connection contact via in the gate interface region<br>S207 |

FIG. 18

MANUFACTURING METHOD OF A THIN FILM TRANSISTOR AND PIXEL UNIT THEREOF

RELATED APPLICATIONS

The present application is a continuation of U.S. patent application Ser. No. 14/373,308, entitled "A MANUFACTURING METHOD OF A THIN FILM TRANSISTOR AND PIXEL UNIT THEREOF", filed on Jul. 18, 2014, which is a national stage application of International Application No. PCT/CN2013/071471, filed on Feb. 6, 2013, the entire content of both of which applications is incorporated herein by reference.

TECHNICAL FIELD

The present invention relates to an electronic technology field, and more particularly, to a manufacturing method of a thin film transistor and pixel unit thereof.

BACKGROUND

Thin film transistor (TFT), such as In—Ga—Zn—O (IGZO) TFT, is a basic circuit component that can be widely used in various electronic system, and has many advantages, such as high electron mobility, low temperature manufacturing process, high stability, transparency and so on. However, with the present manufacturing process for thin film transistor, due to the increased overlaps between gate and source, and between gate and drain, the gate-source parasitic capacitance increases, so that the overall performance of the thin film transistor becomes bad. Further, there is high requirement of alignment between source contact via and gate, and between drain contact via and gate; low-precision mask focusing can cause the source and drain contact vias to become asymmetric, open circuit or short circuit may even arise, and reliability becomes low.

SUMMARY

Technical Problem

Embodiments of the present invention aim at providing a manufacturing method of a thin film transistor to solve the problem that present thin film transistor has poor performance and low reliability.

Solutions to Problems

Technology Solutions

An embodiment of the present invention provides a method of manufacturing a thin film transistor comprising the following steps:

forming a metal oxide layer, a gate insulating layer, a gate metal layer and an etching barrier layer on top of a substrate;

through the same mask, etching a part of the etching barrier layer, the gate metal layer and the gate insulating layer on the substrate, retaining: the metal oxide layer, the gate insulating layer, the gate metal layer and the etching barrier layer in a gate region, and a part of the metal oxide layer, the gate insulating layer and the gate metal layer in the source region and drain region for forming contact vias; and exposing the remaining metal oxide layer in the source region and the drain region;

metallizing the exposed part of the metal oxide layer in the source region and in the drain region to form a part of the source and the drain, and then depositing a passivation layer;

etching the part of the passivation layer, the gate metal layer and the gate insulating layer in the source region and the drain region for forming contact vias, exposing a part of the metal oxide layer in the source region and the drain region for forming the contact vias, thereby forming a source contact via and a drain contact via;

metallizing the exposed part of the metal oxide layer in the source region and the drain region, causing the exposed part of the metal oxide layer to connect with the formed part of the source and the drain respectively, forming complete source and drain;

filling a conductive material into the source contact via and drain contact via.

Another purpose of the present invention is to provide a method of manufacturing a thin film transistor pixel unit comprising the following steps:

forming a metal oxide layer, a gate insulating layer, a gate metal layer and an etching barrier layer on a substrate, wherein the metal oxide layer is in the thin film transistor region;

through the same mask, etching a part of the etching barrier layer, the gate metal layer and the gate insulating layer on the substrate, retaining: the part of the metal oxide layer, the gate insulating layer, the gate metal layer and the etching barrier layer in a gate region, a part of the metal oxide layer, the gate insulating layer and the gate metal layer in a source region and a drain region for forming contact vias, the gate insulating layer, the gate metal layer and the etching barrier layer in a gate interface region, and the gate insulating layer and the gate metal layer in a storage capacitor region; and exposing the remaining metal oxide layer in the source region and the drain region;

metallizing the exposed part of the metal oxide layer in the source region and the drain region to form a part of the source and the drain, and then depositing a passivation layer;

etching the part of the passivation layer in the source region and the drain region for forming contact vias, and the passivation layer in the gate interface region, thereby forming an upper part of a source contact via, a drain contact via and a connection contact via in the gate interface region;

further etching the part of the gate metal layer and the gate insulating layer in the source region and the drain region for forming contact vias, and the etching barrier layer in the gate interface region, exposing the part of the metal oxide layer in the source region and the drain region for forming contact vias, and the gate metal layer in the gate interface region, thereby forming a lower part of the source contact via, the drain contact via and the connection contact via in the gate interface region, and each lower part forms the complete source contact via, the complete drain contact via and the complete connection contact via in the gate interface region with its corresponding upper part;

metallizing the exposed part of the metal oxide layer in the source region and the drain region to connect with the formed part of the source and drain respectively to form the complete source and drain;

filling a conductive material into the source contact via, drain contact via and the connection contact via in the gate interface region.

Beneficial Effects of Invention

Beneficial Effects

In an embodiment of the present invention, a part of the etching barrier layer, the gate metal layer and the gate insulating layer on the substrate are etched through the same mask, while retaining: the metal oxide layer, the gate insulating layer, the gate metal layer and the etching barrier layer in a gate region, and a part of the metal oxide layer, the gate insulating layer and the gate metal layer in a source region and a drain region for forming contact vias, such that the locations of the gate, the source, the drain, the source contact via and the drain contact via are determined in one time, while the source contact via and the drain contact via formed subsequently by replacing the material are of equal distance to the gate. Therefore, the source and drain are self-aligned to the gate, and the source contact via and the drain contact via are self-aligned to and are symmetric about the gate, such that the manufactured thin film transistor does not give rise to a short circuit or open circuit easily and has small parasitic capacitance, and a circuit manufactured with the transistor operates at high speed. In addition, this process is suitable for manufacturing a thin film transistor pixel unit.

BRIEF DESCRIPTION OF THE DRAWINGS

FIG. 1 is a flow chart illustrating a manufacturing method of a thin film transistor provided in the first embodiment of the present invention;

FIG. 18 is a flow chart illustrating a manufacturing method of a thin film transistor pixel unit provided in the second embodiment of the present invention;

DETAILED DESCRIPTION OF THE PREFERRED EMBODIMENTS

In order to more clearly delineate the objectives, technical solutions and the beneficial effects of the present invention, the present invention will be further described hereafter with reference to the drawings and embodiments. However, it shall be understood that the embodiments described herein are only intended to illustrate, but not to limit, the present invention.

In an embodiment of the present invention, a part of the etching barrier layer, the gate metal layer and the gate insulating layer on the substrate are etched through the same mask, while retaining: the metal oxide layer, the gate insulating layer, the gate metal layer and the etching barrier layer in a gate region, and a part of the metal oxide layer, the gate insulating layer and the gate metal layer in a source region and a drain region for forming contact vias, such that the locations of the gate, the source, the drain, the source contact via and the drain contact via are determined by one time, while the source contact via and the drain contact via, formed subsequently by replacing the material, are of equal distance to the gate. Therefore, the source and drain are self-aligned to the gate and the source contact via and the drain contact via are self-aligned to and are symmetric about the gate, such that the manufactured thin film transistor does not easily give rise to a short circuit or open circuit, has small parasitic capacitance, and a circuit manufactured with the transistor operates at high speed.

The following uses a metal oxide thin film transistor as an example to describe in detail embodiments of the present invention.

Embodiment One

FIG. 1 shows a flow chart of a manufacturing method of a thin film transistor provided in an embodiment of the present invention, which is described as following.

In step S101, a metal oxide layer, a gate insulating layer, a gate metal layer and an etching barrier layer is formed on top of a substrate.

Figure 2:
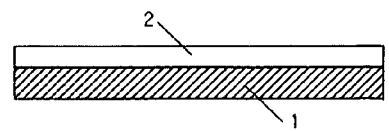
FIG. 2 is a structure schematic diagram illustrating depositing a metal oxide layer on the substrate, according to the first embodiment of the present invention.
Figure 3:
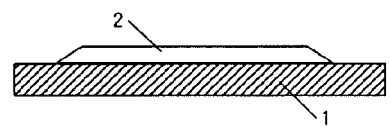
FIG. 3 is a structure schematic diagram illustrating etching a part of the metal oxide layer, according to the first embodiment of the present invention (the substrate is large, after the metal oxide layer outside the thin film transistor region has been etched)
Figure 4:
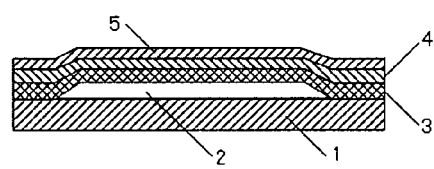
FIG. 4 is a structure schematic diagram illustrating depositing a gate insulating layer, a gate metal layer and an etching barrier layer on the metal oxide layer, according to the first embodiment of the present invention.

As show in FIG. 2, in the embodiment of the present invention, a metal oxide layer 2 is deposited on the substrate 1 first, the material of the substrate 1 may be glass, plastic, etc., and at least one buffer layer may be deposited on the substrate 1 in advance. As show in FIG. 3, the metal oxide layer outside of the thin film transistor region is etched with photolithography process. Then as shown in FIG. 4, a gate insulating layer 3, a gate metal layer 4 and an etching barrier layer 5 are deposited, in this order, on the metal oxide layer 2.

In step S102, through the same mask, a part of the etching barrier layer, the gate metal layer and the gate insulating layer on the substrate are etched, while the metal oxide layer, the gate insulating layer, the gate metal layer and the etching barrier layer in a gate region are retained. The part of the metal oxide layer, the gate insulating layer and the gate metal layer in a source region and a drain region for forming contact vias are also retained. Therefore, the remaining part of the metal oxide layer in the source region and in the drain region is exposed.

Figure 5:
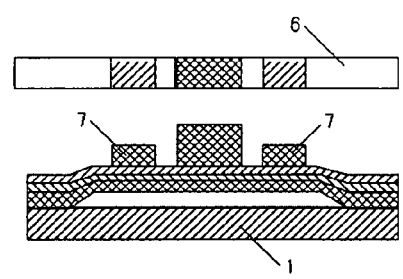
FIG. 5 is a structure schematic diagram illustrating etching a part of the etching barrier layer, the gate metal layer and the gate insulating layer through the same mask, according to the first embodiment of the present invention.

As shown in FIG. 5, in an embodiment of the present invention, a part of the etching barrier layer, a part of the gate metal layer and a part of the gate insulating layer on the substrate 1 are etched through the same mask 6, wherein the photolithography process is used for etching. After a part of the etching barrier layer, a part of the gate metal layer and a part of the gate insulating layer have been etched, the metal oxide layer, the gate insulating layer, the gate metal layer and the etching barrier layer in a gate region are retained; and a part of the metal oxide layer, the gate insulating layer and the gate metal layer in a source region and a drain region for forming contact vias are retained. Meanwhile, the remaining part of the metal oxide layer in the source region and in the drain region is exposed, wherein at least the metal oxide layer between the gate region and the part in the source region and the drain region for forming contact vias are exposed.

Figure 6:
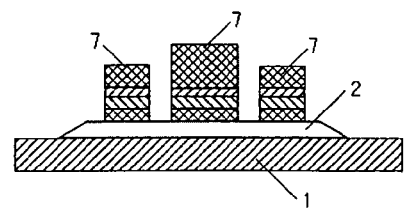
FIG. 6 is a structure schematic diagram illustrating etching the exposed part of the etching barrier layer, and the gate metal layer and gate insulating layer aligned with the exposed part of the etching barrier layer through the same mask, according to the first embodiment of the present invention.
Figure 7:
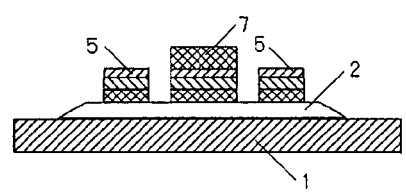
FIG. 7 is a structure schematic diagram illustrating thinning the photoresist until completely removing the part of the photoresist in the source region and the drain region for forming contact vias, according to the first embodiment of the present invention.
Figure 8:
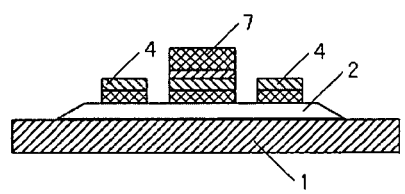
FIG. 8 is a structure schematic diagram illustrating etching the part of the etching barrier layer in the source region and the drain region for forming contact vias, according to the first embodiment of the present invention.
Figure 9:
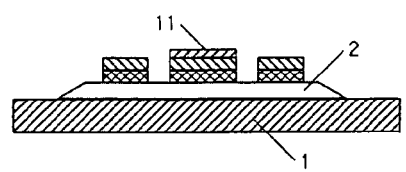
FIG. 9 is a structure schematic diagram illustrating retaining the metal oxide layer, the gate insulating layer, the gate metal layer and the etching barrier layer in the gate region, and a part of the metal oxide layer, the gate insulating layer and, the gate metal in the source region and the drain region layer for forming contact vias, according to the first embodiment of the present invention.

Specifically, a photoresist is coated on the etching barrier layer 5 evenly such that the upper surface of the photoresist becomes a flat surface, and the mask 6 is placed over the photoresist. The mask is a gray scale mask. Then an operating light is projected on the mask 6 to expose and develop the photoresist, which causes the photoresist in the gate region to become thicker than a part of the photoresist in the source region and the drain region for forming the contact vias, while at the same time causing the part of photoresist in the source and drain for forming the contact vias to have equal thickness. With the photoresist in other location removed, the thickness of each part of the photoresist 7 is determined by the transmittance of the corresponding part of the gray scale mask. And then a part of the etching barrier layer, a part of the gate metal layer, and a part of the gate insulating layer are etched. The number of thin film layers etched is determined by the mask 6. During the etching, as shown in FIG. 6, all the exposed etching barrier layer (that is the etching barrier layer not covered by the photoresist) and the gate metal layer and gate insulating layer aligned with the exposed etching barrier layer are etched; then as shown in FIG. 7, the photoresist in each position is thinned until the photoresist in the source region and the drain region for forming the contact vias is completely removed; and then as shown in FIG. 8, the etching barrier layer in the source region and the drain region for forming the contact vias are etched; finally, as shown in FIG. 9, all the photoresist is removed. The operating light may be the ultraviolet light.

In this way, the metal oxide layer, the gate insulating layer, the gate metal layer and the etching barrier layer in a gate region are retained, and a part of the metal oxide layer, the gate insulating layer and the gate metal layer in the source region and drain region for forming the contact vias, are retained. Meanwhile, a part of metal oxide layer is exposed, wherein the metal oxide layer between the gate region and the part in the source region and the drain region for forming contact vias is exposed. Of course, the metal oxide layer around the part in the source region and the drain region where contact vias are to be formed can also be exposed. In this way, the locations of the gate, the source, the drain, the source contact via and the drain contact via are determined in one time, while the source contact via and the drain contact via, subsequently formed by replacing the material, are of equal distance to the gate; therefore, the source and drain are self-aligned to the gate, and the source contact via and the drain contact via are self-aligned to and are symmetric about the gate, such that the manufactured thin film transistor does not easily give rise to short circuit or open circuit, has small parasitic capacitance, and a circuit manufactured with the transistor operates at high speed.

In step S103, the exposed part of the metal oxide layer in the source region and the drain region are metalized to form a part of the source and the drain, and then a passivation layer is deposited.

Figure 10:
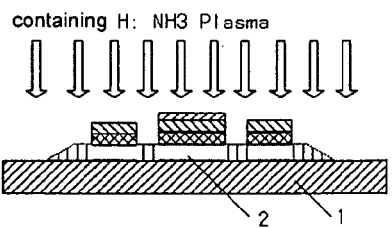
FIG. 10 is a structure schematic diagram illustrating metallizing the exposed part of the metal oxide layer to form a part of the source and the drain, according to the first embodiment of the present invention.

As shown in FIG. 10, in an embodiment of the present invention, a plasma treatment is used to metallize the exposed part of the metal oxide layer in the source region and the drain region. For example, a silicon nitride $SiN_x$:H insulating protection layer in the gate region, source region and drain region is hydrogenated, the hydrogenation process directly metallizing the exposed part of the metal oxide layer in the source region and the drain region to form a part of the source and the drain, significantly saving the processing steps. After metallization, the part of the source and the drain become conductive source and drain. Compared with current state of technology, where self-aligned source and drain device is formed by a plasma (Ar or H-rich NH3), the source and drain resistances of the thin film transistor in an embodiment of present invention is greatly reduced, and the device performance is significantly improved. Meanwhile, since this manufacturing method reduces expensive processing steps, the whole manufacturing cost is reduced. Furthermore, this self-alignment process can minimize the overlaps between the gate and source and between the gate and drain, while the channel size can be precisely controlled, so that the channel dimension can be significantly reduced, and the device performance is improved.

Figure 11:
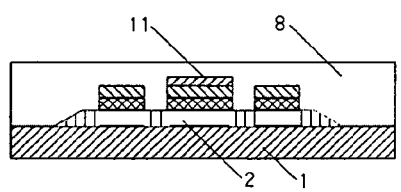
FIG. 11 is a structure schematic diagram illustrating depositing a passivation layer on a side of the substrate, according to the first embodiment of the present invention.

And then, a passivation layer 8 covering the gate region, source region and drain region is deposited, that is, the passivation layer 8 is deposited on a side of the substrate, as shown in FIG. 11, the passivation layer 8 covers the gate region, source region and drain region simultaneously. The passivation layer 8 may be $SiN_x$ thin film or a multilayer thin film of $SiO2/SiN_x$.

In step S104, the part of the metal oxide layer, the gate insulating layer and the gate metal layer in the source region and the drain region for forming contact vias are etched, a part of the metal oxide layer in the source region and the drain region for forming the contact vias are exposed, such that a source contact via and a drain contact via are formed.

In an embodiment of the present invention, the part of the metal oxide layer, the gate insulating layer and the gate metal layer in source region and the drain region for forming the contact vias are etched through a photolithography process, which causes the part of the metal oxide layer in the source region and the drain region for forming the contact vias to be exposed, such that a source contact via and a drain contact via are formed.

Figure 12:
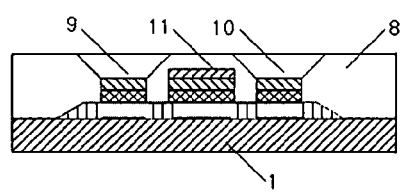
FIG. 12 is a structure schematic diagram illustrating formation of the upper part of the contact vias in the source region and the drain region, according to the first embodiment of the present invention.
Figure 13:
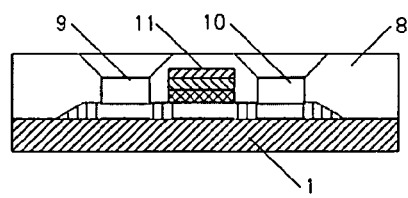
FIG. 13 is a structure schematic diagram illustrating formation of the lower part of the contact vias in the source region and in the drain region, according to the first embodiment of the present invention.

Specifically, as shown in FIG. 12, the part of the passivation layer in the source region and the drain region for forming the contact vias are etched first, such that an upper part of a source contact via and a drain contact via are formed. The side surface of the upper part may be inclined to the metal oxide layer, the requirement of the process is low, and it is easy to implement the photolithography. And then, as shown in FIG. 13, the part of the gate metal layer and the gate insulating layer in the source region and the drain region for forming the contact vias are further etched, until the part of the metal oxide layer in the source region and the drain region for forming the contact vias are exposed, therefore a lower part of the source contact via and the drain contact via are formed. The side surface of the upper part is vertical to the metal oxide layer; in this way, the lower part of the source contact via 9 and the drain contact via 10 are of equal distance to and symmetric over gate 11, such that the manufactured thin film transistor will not give rise to phenomenon such as open circuit, short circuit, etc.

In step S105, the exposed part of the metal oxide layer in the source region and the drain region are metalized to connect with the formed part of the source and drain respectively, and the complete source and drain are formed.

Figure 14:
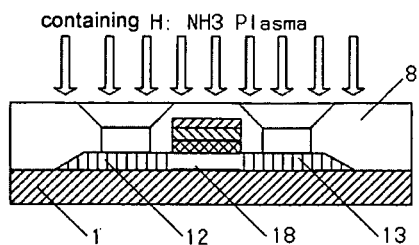
FIG. 14 is a structure schematic diagram illustrating metallizing the exposed part of the metal oxide layer to form the complete source and drain, according to the first embodiment of the present invention.

As shown in FIG. 14, in an embodiment of the present invention, a plasma treatment is first used to metallize the exposed part of the metal oxide layer in the source region and the drain region. For example, a silicon nitride $SiN_x$:H insulating protection layer in the gate region, source region and drain region is hydrogenated, the hydrogenation process directly metallizing the exposed part of the metal oxide layer in the source region and the drain region, and then connect with the formed part of the source and drain respectively to form the complete source and drain. After metallization, the complete source 12 and drain 13 become conductive source and drain, and the metal oxide layer between the source 12 and the drain 13 forms a channel 18 of the thin film transistor.

In step S106, a conductive material is filled in the source contact via and in the drain contact via.

Figure 15:
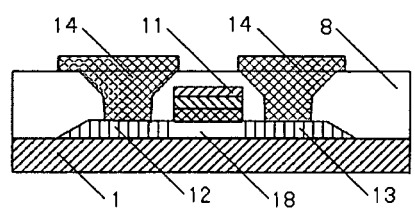
FIG. 15 is a structure schematic diagram illustrating depositing a conductive material within the source contact via and the drain contact via, according to the first embodiment of the present invention.
Figure 16:
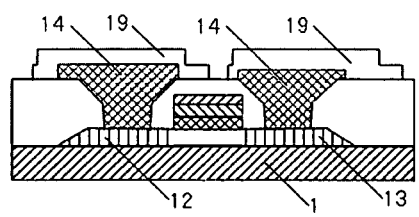
FIG. 16 is a structure schematic diagram illustrating depositing a transparent metal electrode on the passivation layer in the source region and the drain region, according to the first embodiment of the present invention.
Figure 17:
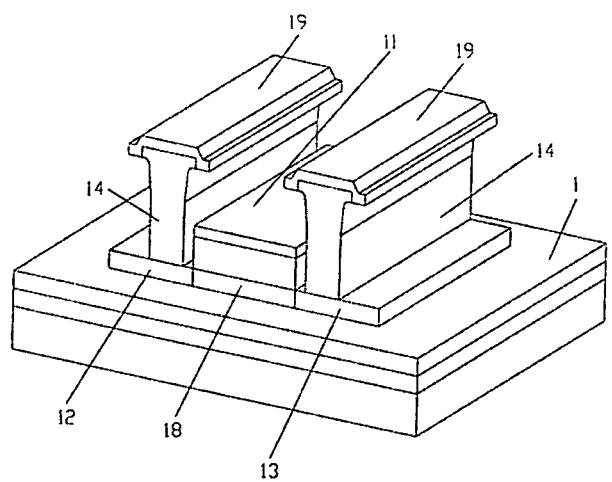
FIG. 17 is a structure schematic diagram illustrating the manufactured metal oxide thin film transistor, according to the first embodiment of the present invention (after the passivation layer is removed)

As shown in FIGS. 15-17, in an embodiment of the present invention, the conductive material 14 is filled in the source contact via 9 and drain contact via 10, causing the conductive material 14 to rise above the passivation layer 8, which is conducive to the formation of subsequent electrodes. Further, a transparent electrode 19 is deposited on the passivation layer in the source region and the drain region. Of course, in the gate region an electrode that passes through the passivation layer and the etching barrier layer can also be formed.

Embodiment Two

FIG. 18 is a flow chart illustrating a manufacturing method of a thin film transistor pixel unit provided in embodiments of the present invention, which is described as following.

In step S201, a metal oxide layer, a gate insulating layer, a gate metal layer and an etching barrier layer are formed on a substrate, wherein the metal oxide layer is in the thin film transistor region.

Figure 19:
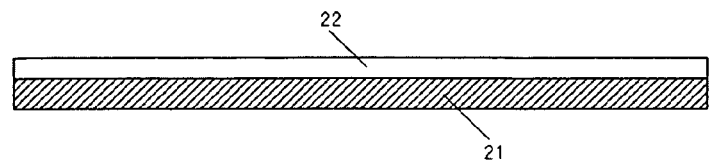
FIG. 19 is a structure schematic diagram illustrating depositing a metal oxide layer on the substrate, according to the second embodiment of the present invention.
Figure 20:
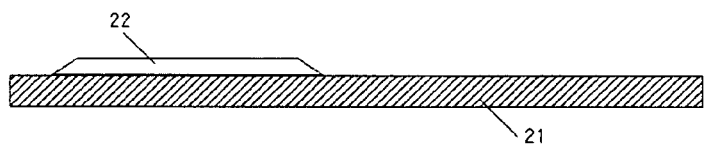
FIG. 20 is a structure schematic diagram illustrating etching the metal oxide layer outside of the thin film transistor region, according to the second embodiment of the present invention.
Figure 21:
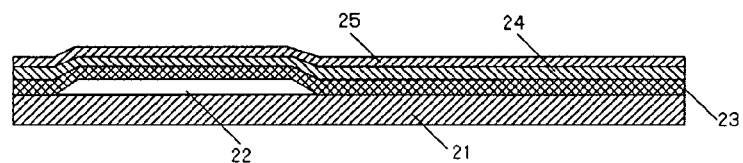
FIG. 21 is a structure schematic diagram illustrating depositing a gate insulating layer, a gate metal layer and an etching barrier layer on the metal oxide layer, according to the second embodiment of the present invention.

As show in FIG. 19, in an embodiment of the present invention, a metal oxide layer 22 is deposited on the substrate 21 first, the material of the substrate 21 may be glass, plastic, etc. At least one buffer layer can also be deposited on the substrate 21 in advance. As show in FIG. 20, to manufacture a thin film transistor pixel unit with a storage capacitor, the metal oxide layer on the substrate 21 outside of the thin film transistor region needs to be etched. Of course, photolithography process can be used to etch the metal oxide layer out of the thin film transistor region. And then, as shown in FIG. 21, a gate insulating layer 32, a gate metal layer 24 and an etching barrier layer 25 are deposited, in this order, on the metal oxide layer 22 and the substrate 21.

In step S202, through the same mask, the etching barrier layer, the gate metal layer and the gate insulating layer on the substrate are etched; the metal oxide layer, the gate insulating layer, the gate metal layer and the etching barrier layer in a gate region are retained; a part of the metal oxide layer, the gate insulating layer and the gate metal layer in the source region and the drain region for forming contact vias are retained; the gate insulating layer, the gate metal layer and the etching barrier layer in a gate interface region, and the gate insulating layer and the gate metal layer in a storage capacitor region are retained; the remaining metal oxide layer in the source region and in the drain region is exposed.

Figure 22:
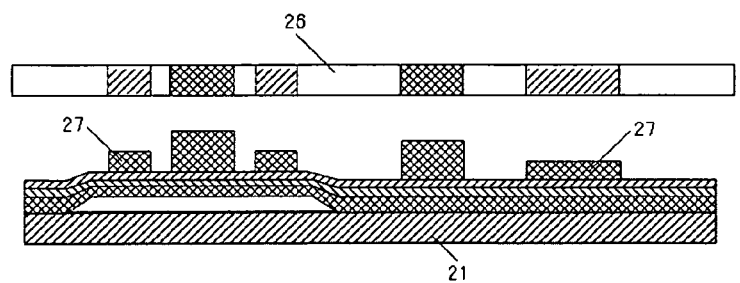
FIG. 22 is a structure schematic diagram illustrating etching a part of the etching barrier layer, gate metal layer and gate insulating layer through the same mask, according to the second embodiment of the present invention.

As shown in FIG. 22, in embodiments of the present invention, through the same mask 26, a part of the etching barrier layer, a part of the gate metal layer and a part of the gate insulating layer on the substrate 21 are etched, wherein photolithography process is used for etching. After a part of the etching barrier layer, a part of the gate metal layer, and a part of the gate insulating layer are etched, the metal oxide layer, the gate insulating layer, the gate metal layer and the etching barrier layer in a gate region are retained; a part of the metal oxide layer, the gate insulating layer and the gate metal layer in a source region and a drain region for forming contact vias, the gate insulating layer, the gate metal layer and the etching barrier layer in a gate interface region, and the gate insulating layer and the gate metal layer in a storage capacitor region, are retained. Meanwhile, the remaining metal oxide layer in the source region and the drain region is exposed, wherein at least the metal oxide layer between the gate region and the part in a source region and a drain region for forming contact vias is exposed.

Figure 23:
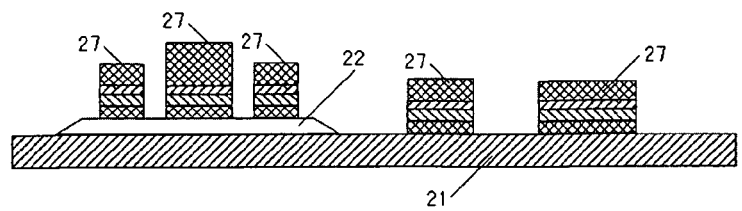
FIG. 23 is a structure schematic diagram illustrating etching, through the same mask, the exposed part of the etching barrier layer, and the gate metal layer and gate insulating layer aligned with the exposed part of the etching barrier layer, according to the second embodiment of the present invention.
Figure 24:
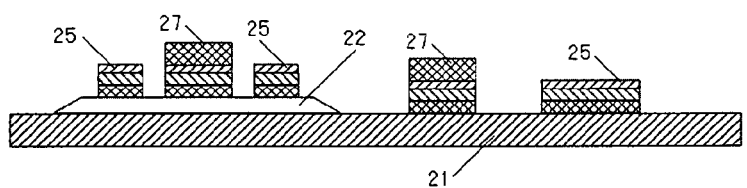
FIG. 24 is a structure schematic diagram illustrating thinning the photoresist until completely removing the photoresist in the storage capacitor region and the part of photoresist in the source region and the drain region for forming the contact vias, according to the second embodiment of the present invention.
Figure 25:
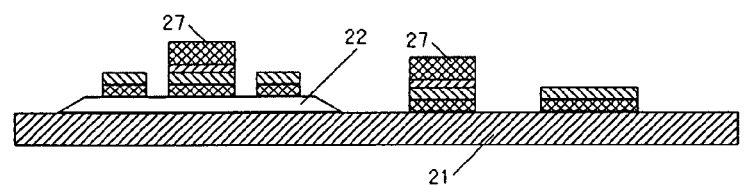
FIG. 25 is a structure schematic diagram illustrating etching the etching barrier layer in the storage capacitor region and the part of the etching barrier layer in the source region and the drain region for forming the contact vias, according to the second embodiment of the present invention.
Figure 26:
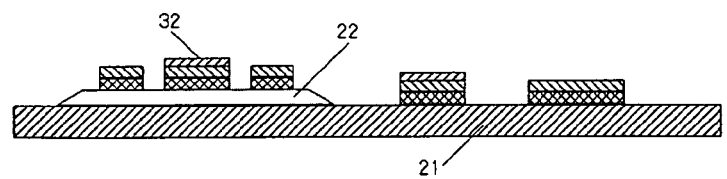
FIG. 26 is a structure schematic diagram illustrating retaining the metal oxide layer, the gate insulating layer, the gate metal layer and the etching barrier layer in the gate region, a part of the metal oxide layer, the gate insulating layer and the gate metal layer in the source region and the drain region for forming contact vias, the gate insulating layer, the gate metal layer and the etching barrier layer in a gate interface region, and the gate insulating layer and the gate metal layer in a storage capacitor region, according to the second embodiment of the present invention.

Specifically, a photoresist is first coated on the etching barrier layer 25 evenly, and the mask 26 is placed above the photoresist. And then an operating light is projected on the mask 26 to expose and to develop the photoresist, to cause the photoresist in the gate region and the gate interface region to become thicker than the part of the photoresist in the source region and the drain region for forming the contact vias, and the photoresist in the storage capacitor region; and to cause the photoresist in the gate region and in the gate interface region to have equal thickness, to cause the part of the photoresist in the source region and in the drain region for forming contact vias to have equal thickness as the photoresist in the storage capacitor region, and to cause the part of the photoresist in the source region and the drain region for forming the contact vias to have equal thickness; and the photoresist in other locations is removed. At this point, the thickness of each part of the photoresist 7 is determined by the transmittance of each corresponding part of the gray scale mask. And then, part of the etching barrier layer, part of the gate metal layer, and part of the gate insulating layer on the substrate 21 are etched, the number of thin film layers etched is determined by the mask 6. In particular, during etching, as shown in FIG. 23, all the exposed etching barrier layer (that is, the etching barrier layer not covered by the photoresist) and the gate metal layer and gate insulating layer aligned with the exposed etching barrier layer, are etched; and then, as shown in FIG. 24, the photoresist in each position is thinned until the part of the photoresist in the source region and the drain region for forming contact vias, and the photoresist in the storage capacitor region, are completely removed; and then as shown in FIG. 25, the etching barrier layer in the source region and the drain region for forming the contact vias, and the etching barrier layer in the storage capacitor region, are etched; finally, as shown in FIG. 26, all the photoresist is removed. The operating light may be the ultraviolet.

In this way, the metal oxide layer, the gate insulating layer, the gate metal layer and the etching barrier layer in a gate region are retained; a part of the metal oxide layer, the gate insulating layer and the gate metal layer in a source region and a drain region for forming contact vias are retained; and the gate insulating layer, the gate metal layer and the etching barrier layer in a gate interface region are retained; and the gate insulating layer and the gate metal layer in a storage capacitor region are retained. Meanwhile, the remaining metal oxide layer in the source region and the drain region is exposed, wherein the metal oxide layer between the gate region, and the part in the source region and in the drain region for forming contact vias, is exposed. Of course, the metal oxide layer around the part of the source region and the drain region for forming contact vias can be also exposed. In this way, the locations of the gate, the source, the drain, the source contact via and the drain contact via can be determined in one time, while the source contact via and the drain contact via, subsequently formed by replacing the material, are of equal distance to the gate; therefore, the source and drain are self-aligned to the gate, and the source contact via and the drain contact via are self-aligned to and are symmetric about the gate, such that the manufactured thin film transistor does not easily give rise to short circuit or open circuit, has small parasitic capacitance, and a circuit manufactured with the transistor operates at high speed. At the same time, with the locations of the storage capacitor and the gate interface determined, the etching barrier layer in the storage capacitor region is removed to facilitate subsequent procedure of converting the gate metal layer in the storage capacitor region to become an electrode 36 of the storage capacitor.

In other words, since in the embodiments of the present invention, there is no need for alignment among a plurality of the masks, and the locations of the gate, the source, the drain, the source contact via and the drain contact via are determined with the same mask 26, and the source contact via and the drain contact via are completely self-aligned to and are symmetrical about the gate, and the performance of the manufactured thin film transistor is significantly improved.

In step S203, the exposed part of the metal oxide layer in the source region and the drain region are metalized to form a part of the source and the drain, and then a passivation layer is deposited.

Figure 27:
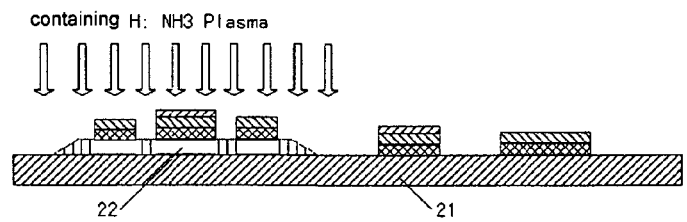
FIG. 27 is a structure schematic diagram illustrating metallizing the exposed part of the metal oxide layer to form a part of the source and the drain, according to the second embodiment of the present invention.

As shown in FIG. 27, in the embodiments of the present invention, a plasma treatment is used to metallize the exposed part of the metal oxide layer in the source region and the drain region. For example, a silicon nitride $SiN_x$:H insulating protection layer in the gate region, source region and drain region is hydrogenated, the hydrogenation process directly metallizing the exposed metal oxide layer in the source region and the drain region to become part of the source and drain. After metallization, the part of the source and the part of the drain become conductive source and drain.

Figure 28:
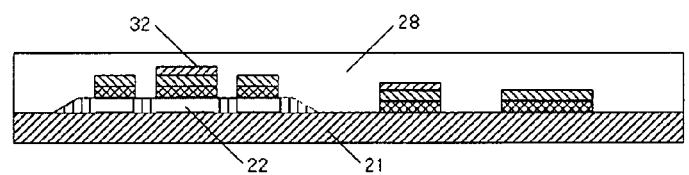
FIG. 28 is a structure schematic diagram illustrating depositing a passivation layer on a side of the substrate, according to the second embodiment of the present invention.

And then, a passivation layer 28 covering the gate region, source region, drain region, gate interface region and storage capacitor region is deposited, wherein the passivation layer 28 is deposited on a side of the substrate 21, as shown in FIG. 28, while at the same time the passivation layer 28 also covers the gate region, source region, drain region, gate interface region, and storage capacitor region. The passivation layer 28 may be $SiN_x$ thin film or a multilayer thin film of $SiO_2/SiN_x$.

In step S204, the passivation layer in the source region and the drain region for forming contact vias, and the passivation layer in the gate interface region, are etched, thereby forming an upper part of source contact via, drain contact via, and connection contact via in the gate interface region.

Figure 29:
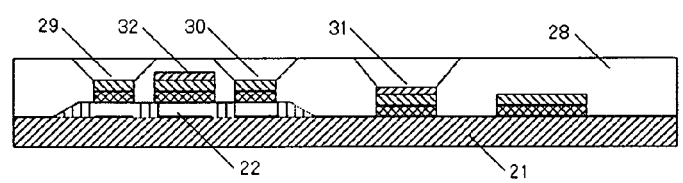
FIG. 29 is a structure schematic diagram illustrating formation of the upper part of the contact vias in the source region, the drain region and the gate interface region, according to the second embodiment of the present invention.

As shown in FIG. 29, the passivation layer in the source region and the drain region for forming contact vias, and the passivation layer in the gate interface region, are etched through the photolithography process, thereby forming an upper part of a source contact via 29, a drain contact via 30 and a connection contact via 31 in the gate interface region. The side surface of the upper part can be inclined to the metal oxide layer, the requirement of the process is low, and photolithography can be easily carried out.

In step S205, the gate metal layer and the gate insulating layer in the source region and the drain region for forming contact vias, and the etching barrier layer in the gate interface region, are etched further; the part of the metal oxide layer in the source region and the drain region for forming the contact vias, and the gate metal layer in the gate interface region, are exposed, thereby forming a lower part of the source contact via, the drain contact via and the connection contact via in the gate interface region, with each lower part forming the complete source contact via, drain contact via and connection contact via in the gate interface region with its corresponding upper part.

Figure 30:
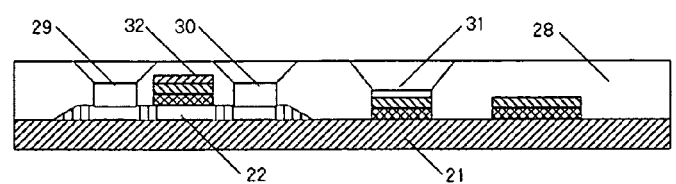
FIG. 30 is a structure schematic diagram illustrating the part in the source region, the drain region and the gate interface region for forming the lower part of the contact vias, according to the second embodiment of the present invention.

As shown in FIG. 30, in the embodiments of the present invention, the gate metal layer and the gate insulating layer in the source region and the drain region for forming contact vias, and the etching barrier layer in the gate interface region are etched further, until the part of the metal oxide layer in the source region and the drain region for forming the contact vias, and the gate metal layer in the gate interface region, are exposed, thereby forming the lower part of the source contact via 29, the drain contact via 30 and the connection contact via 31 in the gate interface region, and each lower part forms the complete source contact via, drain contact via and connection contact via in the gate interface region with its corresponding upper part. The side surface of the lower part of the source contact via 29 and the drain contact via 30 are vertical to the metal oxide layer, such that the source contact via 29 and the drain contact via 30 are of equal distance to and are symmetric over the gate 11, wherein the manufactured thin film transistor does not give rise to the phenomenon of open circuit, short circuit, etc.

In step S206, the exposed part of the metal oxide layer in the source region and the drain region are metalized to connect with the formed part of the source and drain respectively to form the complete source and drain.

Figure 31:
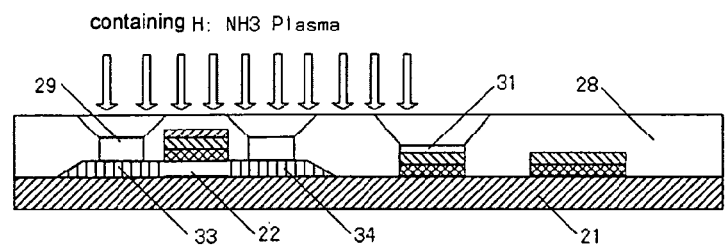
FIG. 31 is a structure schematic diagram illustrating metallizing the exposed part of the metal oxide layer to form the complete source and drain, according to the second embodiment of the present invention.

As shown in FIG. 31, in the embodiments of the present invention, a plasma treatment is used to metallize the exposed part of the metal oxide layer in the source region and the drain region. For example, a silicon nitride $SiN_x$:H insulating protection layer of in the gate region, source region and drain region is hydrogenated, the hydrogenation process directly metallizing the exposed part of the metal oxide layer in the source region and the drain region to connect with the formed part of the source and drain respectively to form the complete source and drain. After metallization, the complete source 33 and drain 34 are conductive, and the metal oxide layer between the source 33 and the drain 34 forms a channel 38 of the thin film transistor.

In step S207, a conductive material is filled in the source contact via, drain contact via and the connection contact via in the gate interface region.

Figure 32:
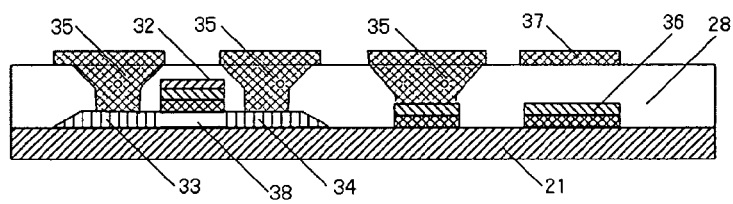
FIG. 32 is a structure schematic diagram illustrating depositing a conductive material in the source contact via, the drain contact via and the connection contact via in the gate interface region, according to the second embodiment of the present invention.
Figure 33:
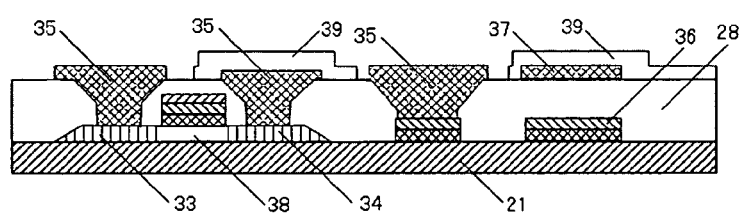
FIG. 33 is a structure schematic diagram illustrating depositing a transparent metal electrode, according to the second embodiment of the present invention.
Figure 34:
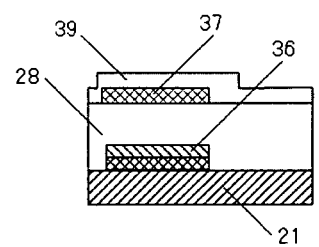
FIG. 34 is a structure schematic diagram illustrating the manufactured storage capacitor, according to the second embodiment of the present invention.

As shown in FIGS. 32-34, in the embodiments of the present invention, conductive material 35 (such as metal) is filled in the source contact via 29, drain contact via 30 and the connection contact via 31 in the gate interface region, and the conductive material 35 rises above the passivation layer 28, which is conducive to the formation of subsequent electrode. Besides, transparent electrode 39 is deposited on the passivation layer in the source region and the drain region respectively. When the conductive material 35 is filled in the source contact via 29, drain contact via 30 and the connection contact via 31 in the gate interface region, on the passivation layer in the storage capacitor region another conductive material (such as metal layer) is deposited for forming another other electrode 37 of the storage capacitor, and the process is simple. Here, the passivation layer in the storage capacitor region is used as a dielectric layer of the storage capacitor, which is thinner than the dielectric layer of the storage capacitor with bottom gate structure, such that unit-area capacitance is provided, the size of the capacitor is reduced, and the aperture speed is increased. Of course, an electrode passing through the passivation layer and the etching barrier layer can also be formed in the gate region. It should be noted the manufacturing process of this thin film transistor with top gate structure is simpler than the manufacturing process of thin film transistor with bottom gate structure, and the manufacturing cost is reduced.

The descriptions above only refer to some of the better embodiments of the present disclosure but are not intended to limit the scope of the present invention. Every modification, equivalent replacement and improvement etc., made within the spirit and principle of the present invention should be included within the scope of the present invention.

What is claimed is:

1. A method of manufacturing a thin film transistor pixel unit, comprising the following steps:
    forming a metal oxide layer, a gate insulating layer, a gate metal layer and an etching barrier layer on a substrate, wherein the metal oxide layer is in a thin film transistor region;
    coating a photoresist on the etching barrier layer, and placing a same mask over the photoresist;
    a first etching through the same mask to remove a part of the etching barrier layer, the gate metal layer and the gate insulating layer on the substrate, and retaining the metal oxide layer, the gate insulating layer, the gate metal layer, the etching barrier layer and the photoresist tin a gate region, the metal oxide layer, the gate insulating layer, the gate metal layer and the photoresist in a source region and a drain region for forming contact vias, respectively, the gate insulating layer, the gate metal layer, the etching barrier layer and the photoresist in a gate interface region, and the gate insulating layer, the gate metal layer and the photoresist in a storage capacitor region;

thinning to remove the photoresist in the source region, the drain region and the storage capacitor region;

a second etching to remove the photoresist in the gate region and the gate interface region;

exposing the remaining metal oxide layer in the source region, the drain region and the gate region;

metallizing the exposed metal oxide layer in the source region and the drain region to form the source and the drain, and then depositing a passivation layer;

etching the passivation layer in the source region and the drain region for forming contact vias, and the passivation layer in the gate interface region, thereby forming an upper part of a source contact via, a drain contact via and a connection contact via in the gate interface region;

further etching the gate metal layer and the gate insulating layer in the source region and the drain region for forming contact vias, and the etching barrier layer in the gate interface region, and exposing the metal oxide layer in the source region and the drain region for forming contact vias, the gate metal layer in the gate interface region, thereby forming a lower part of the source contact via, a lower part of the drain contact via and a lower part of the connection contact via in the gate interface region, with each lower part forming the complete source contact via, drain contact via and connection contact via in the gate interface region with its corresponding upper part;

metallizing the exposed metal oxide layer in the source region and the drain region, and connecting them to the formed lower parts of the source and the drain respectively to form the source and drain; and filling a conductive material in the source contact via, the drain contact via and the connection contact via in the gate interface region.

2. The method of claim 1, further comprising: before the first etching step: projecting an operating light on the mask to expose and to develop the photoresist, to cause the photoresist in the gate region to be thicker than the photoresist in the source region and in the drain region for forming contact vias, and the photoresist in the storage capacitor region; wherein the mask is a gray scale mask, the thickness of the photoresist is determined by the transmittance of each part of the gray scale mask.

3. The method of claim 1, wherein the step of metallizing the exposed metal oxide layer in the source region and the drain region to form the source and the drain, and then depositing a passivation layer further comprises:

using a plasma treatment to metallize the exposed metal oxide layer in the source region and the drain region to form the source and the drain; and depositing the passivation layer covering the gate region, the source region, the drain region, the gate interface region and the storage capacitor region.

4. The method of claim 3, wherein the step of using a plasma treatment to metallize the exposed metal oxide layer in the source region and the drain region to form the source and the drain further comprises: hydrogenating a silicon nitride $SiN_x$:H insulating protection layer in the gate region, source region and drain region, the hydrogenation process directly metallizing the exposed metal oxide layer in the source region and the drain region, thereby forming the source and the drain.

5. The method of claim 1, wherein the step of metallizing the exposed metal oxide layer in the source region and the drain region, and connecting them to the formed lower parts of the source and the drain respectively to form the source and drain further comprises:

using a plasma treatment to metallize the exposed metal oxide layer in the source region and the drain region to connect them to the formed lower parts of the source and drain for forming the complete source and drain.

6. The method of claim 5, wherein the step of using a plasma treatment to metallize the exposed metal oxide layer in the source region and the drain region to connect them to the formed lower parts of the source and drain for forming the complete source and drain further comprises:

hydrogenating a silicon nitride $SiN_x$:H insulating protection layer in the gate region, the source region and the drain region, the hydrogenation process directly metallizing the exposed metal oxide layer in the source region and the drain region, connecting them to the formed lower parts of the source and the drain respectively for forming the complete source and drain.

* * * * *